United States Patent
Wang et al.

(10) Patent No.: US 7,610,947 B2
(45) Date of Patent: Nov. 3, 2009

(54) HEAT-DISSIPATING MODEL

(75) Inventors: Chin-Wen Wang, Gueishan Township, Taoyuan County (TW); Ching-Chung Wang, Gueishan Township, Taoyuan County (TW); Pei-Choa Wang, Gueishan Township, Taoyuan County (TW)

(73) Assignee: Pyroswift Holding Co., Limited, Hong Kong (HK)

( * ) Notice: Subject to any disclaimer, the term of this patent is extended or adjusted under 35 U.S.C. 154(b) by 627 days.

(21) Appl. No.: 11/459,453

(22) Filed: Jul. 24, 2006

(65) Prior Publication Data

US 2007/0079954 A1    Apr. 12, 2007

(30) Foreign Application Priority Data

Oct. 11, 2005    (TW) .............................. 94217518 U

(51) Int. Cl.
*F21V 29/00*    (2006.01)
*F28D 15/04*    (2006.01)

(52) U.S. Cl. ............ 165/80.3; 165/104.26; 165/104.33; 362/294

(58) Field of Classification Search ............ 165/104.26, 165/104.33, 169; 362/294
See application file for complete search history.

(56) References Cited

U.S. PATENT DOCUMENTS

| | | | | |
|---|---|---|---|---|
| 2,901,654 A | * | 8/1959 | Myers | 313/113 |
| 3,658,125 A | * | 4/1972 | Freggens | 165/80.4 |
| 3,714,981 A | * | 2/1973 | Noren | 165/47 |
| 3,791,372 A | * | 2/1974 | Hatsopoulos et al. | 126/374.1 |
| 4,633,371 A | * | 12/1986 | Nagy et al. | 361/699 |
| 5,561,338 A | * | 10/1996 | Roberts et al. | 313/46 |
| 6,802,363 B1 | * | 10/2004 | Wang | 165/104.26 |
| 7,051,794 B2 | * | 5/2006 | Luo | 165/104.26 |
| 7,210,832 B2 | * | 5/2007 | Huang | 362/547 |
| 7,269,013 B2 | * | 9/2007 | Chen et al. | 361/700 |
| 2002/0080582 A1 | * | 6/2002 | Chang | 361/700 |
| 2003/0066628 A1 | * | 4/2003 | Mochizuki et al. | 165/104.26 |
| 2004/0108104 A1 | * | 6/2004 | Luo | 165/181 |
| 2004/0120148 A1 | * | 6/2004 | Morris et al. | 362/264 |
| 2005/0041428 A1 | * | 2/2005 | Zhang | 362/294 |
| 2005/0111234 A1 | * | 5/2005 | Martin et al. | 362/555 |
| 2005/0169006 A1 | * | 8/2005 | Wang et al. | 362/555 |
| 2006/0193139 A1 | * | 8/2006 | Sun et al. | 362/373 |
| 2006/0290891 A1 | * | 12/2006 | Wang et al. | 353/52 |
| 2008/0298066 A1 | * | 12/2008 | Van De Voorde et al. | 362/264 |

FOREIGN PATENT DOCUMENTS

GB    1487322 A    *    9/1977

* cited by examiner

*Primary Examiner*—Allen J Flanigan
(74) *Attorney, Agent, or Firm*—Chun-Ming Shih

(57) ABSTRACT

A heat-dissipating model includes a heat-conducting member and a heat-dissipating body. The heat-conducting member has a hollow cylinder with a closed end. The interior of the wall of the cylinder is formed with a vacuum chamber. The vacuum chamber is provided with a capillary structure and a working fluid therein. The heat-dissipating body has a through hole for connecting to the outer periphery of the heat-conducting member. Further, the periphery of the heat-dissipating body is provided with a plurality of heat-dissipating fins. With the above arrangement, the heat generated by the heat source can be dissipated to a far place, so that it can be continuously operated at a lower temperature. As a result, the effect of heat conduction or dissipation can be improved and the life is extended.

9 Claims, 7 Drawing Sheets

HEAT-DISSIPATING MODEL

BACKGROUND OF THE INVENTION

1. Field of the Invention

The present invention relates to a heat-dissipating model, and in particular to a heat-dissipating model capable of conducting the heat generated by the heat source to a far place, so that it can be continuously operated at a lower temperature. As a result, the effect of heat conduction or dissipation can be improved and the life is extended.

2. Description of Prior Art

With the development and progress of the information technology and the computer industry, the heat generated by the electronic elements (such as the central processing unit or memory) becomes larger but their size is much smaller and smaller. Therefore, in order to efficiently dissipate such a dense heat to the environment outside the system and maintain the elements to be operated under the allowable temperature, in most cases, the heat-dissipating model is formed of heat-dissipating pieces each having a larger area. Alternatively, the rotation speed of the heat-dissipating fan is increased, thereby to increase the efficiency in the heat dissipation. However, such manners cause more problems such as noise, weight, cost and complexity of the system. Therefore, the above-mentioned solutions are not good countermeasures for solving the problems in the heat dissipation of the electronic elements.

Further, the conventional projecting light is constituted of a reflecting cover having an insertion hole and a halogen bulb inserted in the insertion hole. Due to the high working temperature, short life and great electricity consumption of the halogen bulb, the halogen bulb is gradually replaced with a light-emitting unit formed by packaging light-emitting diodes (LED) and a circuit board. Although such kind of projecting light is energy-saving and long life, in practice, heat will be inevitably generated on the circuit board. In order to solve this problem, some manufacturers provide a plurality of heat-dissipating fins on the reflecting cover. With the heat conduction and heat dissipation of the material of the cover and the heat convection between temperature of the ambient air and that of the heat-dissipating fins, the heat can be dissipated to the outside. However, the heat conducted and dissipated to the outside by this heat-dissipating model is so limited that the light-emitting unit operates at a high-temperature environment for a long time, causing the reduction in the life greatly. Therefore, it is an important issue for those skilled in this art to provide a heat-dissipating model for the electronic elements and the LED projecting lamps.

In view of the above, the inventor proposes the present invention to overcome the above problems based on his expert experiences and deliberate researches.

SUMMARY OF THE INVENTION

The present invention is to provide a heat-dissipating model capable of conducting the heat generated by the heat source to a far place, so that it can be continuously operated at a lower temperature. As a result, the effect of heat conduction or dissipation can be improved and the life is extended.

The present invention provides a heat-dissipating model comprising a heat-conducting member and a heat-dissipating body. The heat-conducting member has a hollow cylinder with a closed end. The interior of the wall of the cylinder is formed with a vacuum chamber. The vacuum chamber is provided with a capillary structure and a working fluid therein. The heat-dissipating body has a through hole for connecting to the outer periphery of the heat-conducting member. Further, the periphery of the heat-dissipating body is provided with a plurality of heat-dissipating fins.

BRIEF DESCRIPTION OF THE DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

The characteristics and the technical contents of the present invention will be described with reference to the following detailed description and the accompanying drawings. However, it should be understood that the drawings are illustrative but not used to limit the scope of the present invention.

Figure 1:
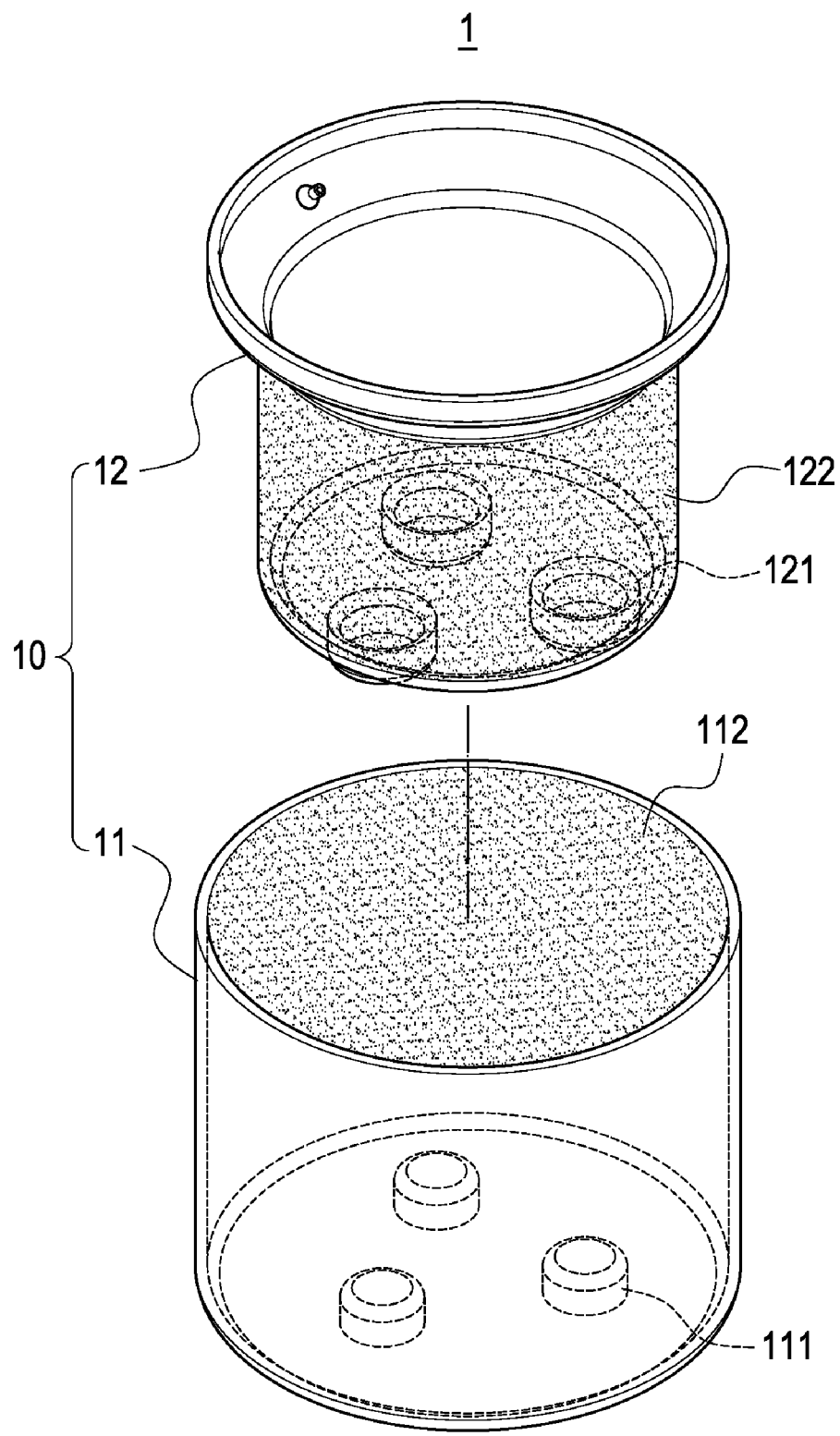
FIG. 1 is an exploded perspective view of a heat-conducting member of the present invention.
Figure 2:
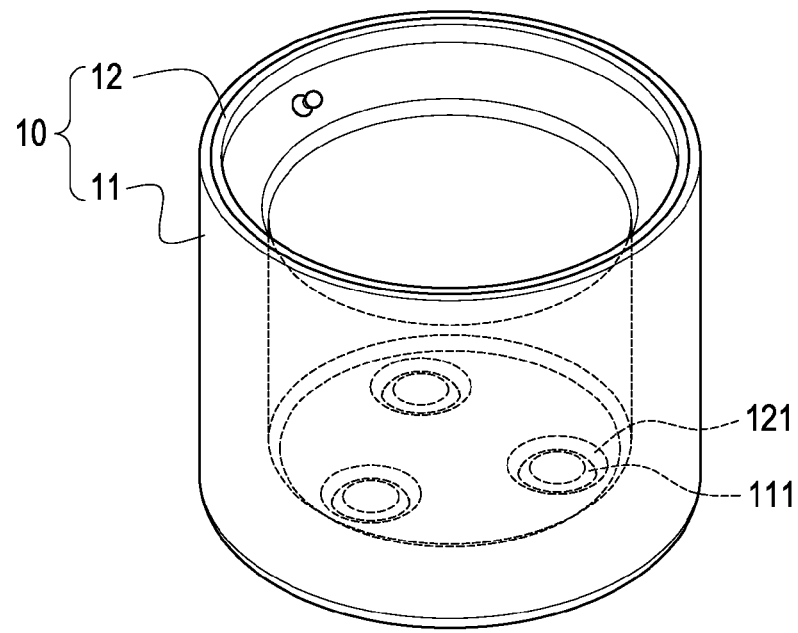
FIG. 2 is an assembled schematic view of the heat-conducting member of the present invention.
Figure 3:
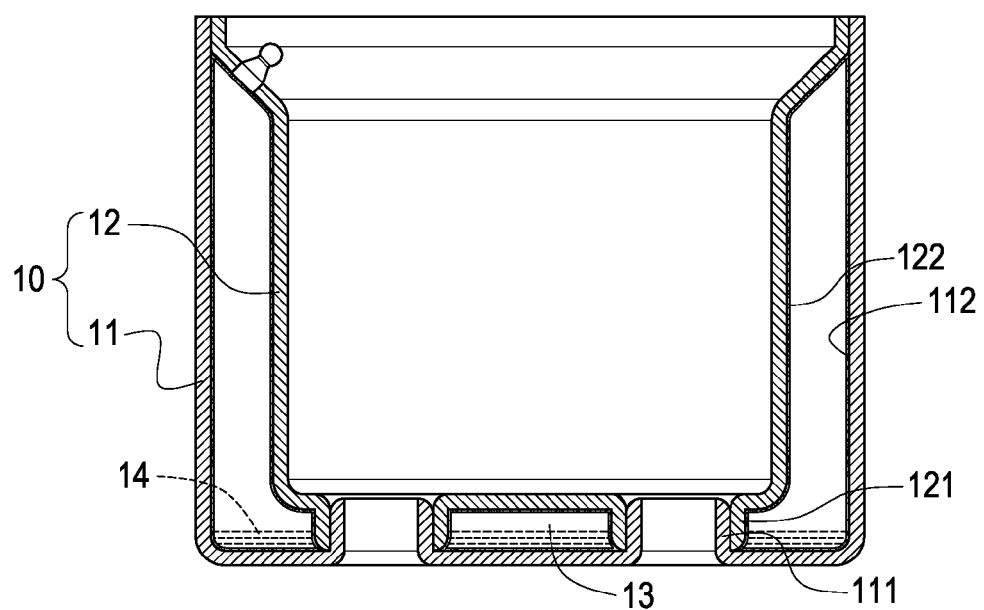
FIG. 3 is an assembled cross-sectional view of the heat-conducting member of the present invention.

FIGS. 1, 2 and 3 are an exploded perspective view, an assembled schematic view and an assembled cross-sectional view of a heat-conducting member of the present invention, respectively. The present invention is directed to a heat-dissipating module comprising a heat-conducting member 1 and a heat-dissipating body 2.

Figure 8:
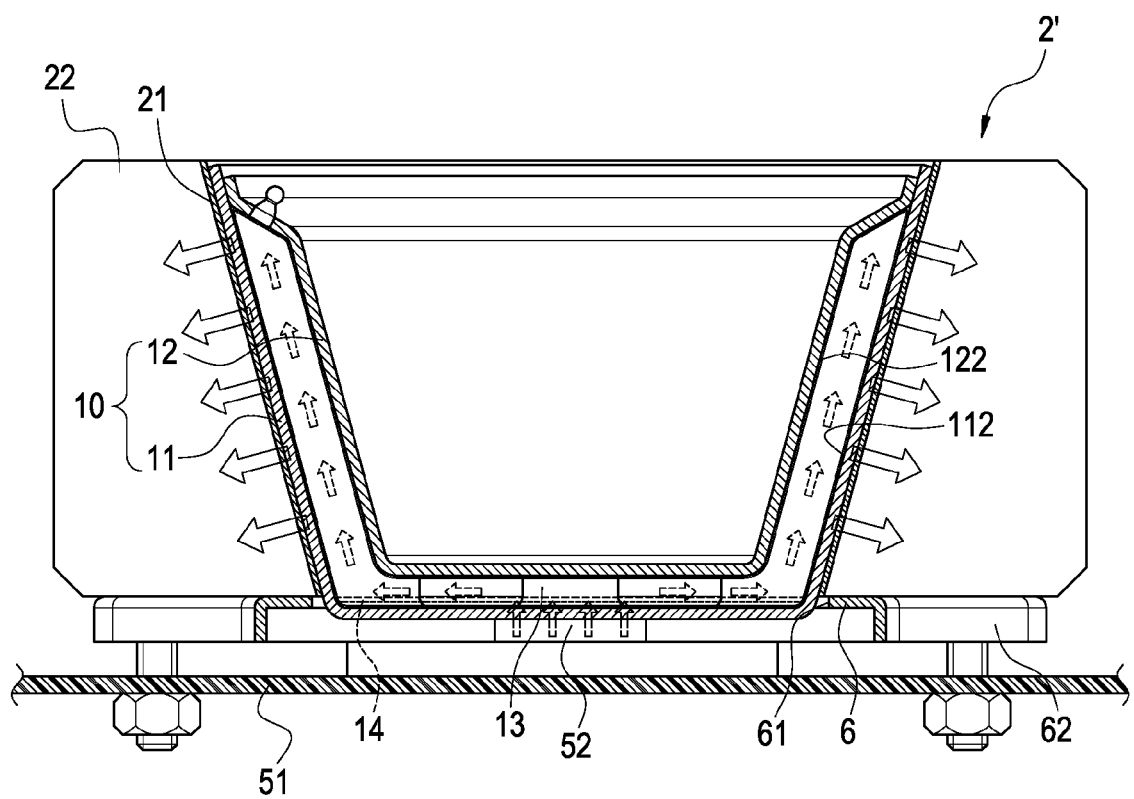
FIG. 8 is a cross-sectional view showing the operating state in which another embodiment of the present invention is applied to a microprocessor.

The heat-conducting member 1 has a hollow cylinder 10 with a closed end. The cross section of the cylinder 10 can be a circle, cone (as shown in FIG. 8), rectangle, pyramid, regular polygon or other different shapes. In the present embodiment, the cross section of the cylinder is a circle. The cylinder is constituted of an outer casing 11 and an inner casing 12 connected to the inside of the outer casing 11. A plurality of positioning posts 111 extends upwardly from the bottom of the outer casing 11. A plurality of projecting rings 121 extends downwardly from the bottom of the inner casing 12. The positioning posts 111 are respectively inserted into the projecting rings 121. A partition space 13 (as shown in FIG. 3) is formed between the outer casing 11 and the inner casing 12. Further, on the inner surface of the outer casing 11 and the outer surface of the inner casing 12, capillary structures 112 and 122 are respectively coated thereon. The capillary structures 112, 122 can be made of porous materials formed by sintering metallic powders, or made of metallic woven mesh or the combination of the two.

In manufacturing, the capillary structures 112, 122 are connected onto the predetermined positions of the outer casing 11 and the inner casing 12 by sintering (or positioning), respectively. Then, the projecting rings 121 of the inner casing 12 are exactly connected onto the positioning posts 111 of the outer casing 11. At the connecting positions between the top edge of the inner casing 12 and the inside surface of the outer casing 11, the inner casing 12 and the outer casing 11 are welded together. After that, a working fluid 14 such as pure water (as shown in FIG. 3) is injected into the partition pace 13 of the cylinder 10. Then, the partition space 13 is subjected to a vacuum treatment and a sealing process. As a result, the heat-conducting member 1 of the present invention is constructed.

Figure 4:
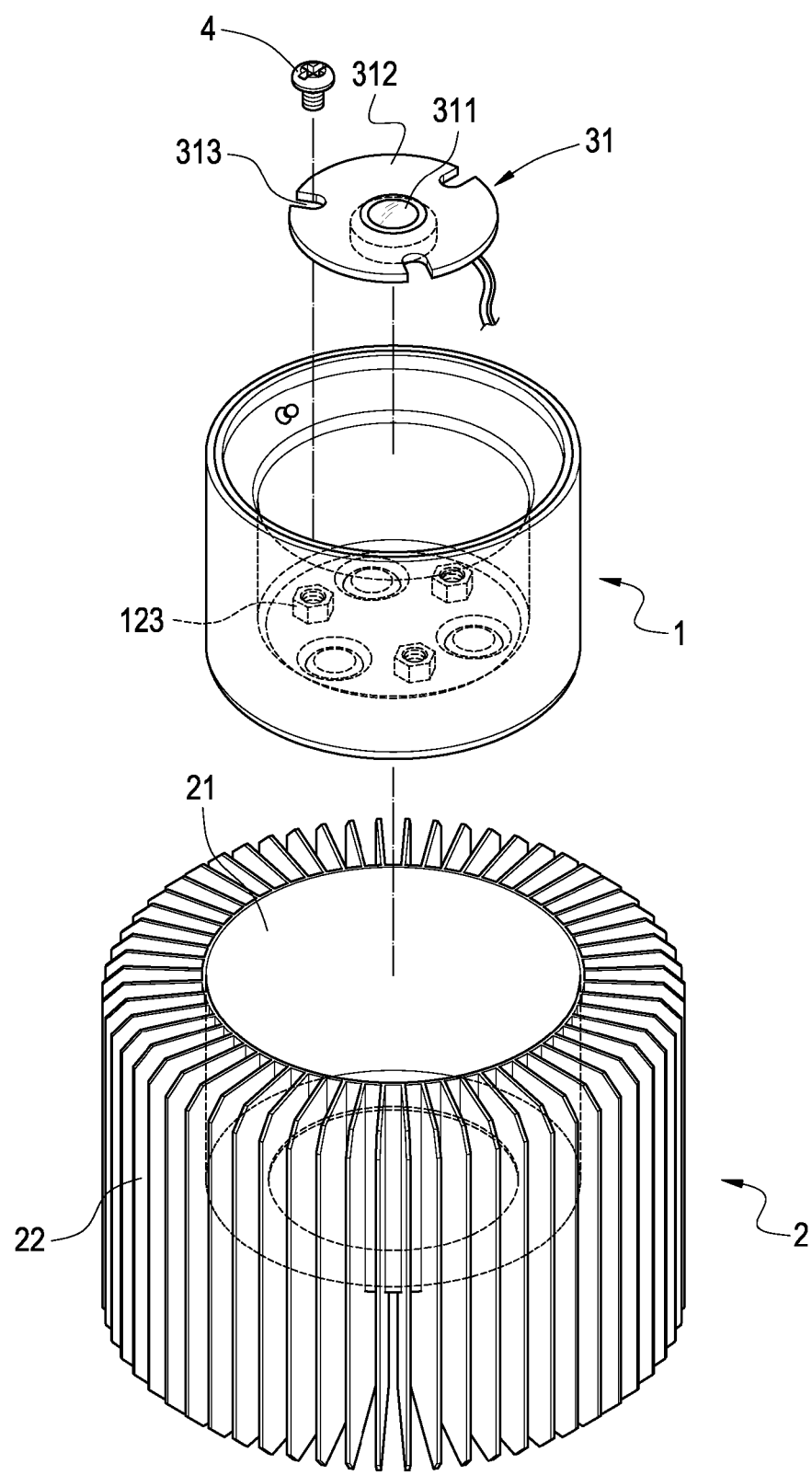
FIG. 4 is an exploded perspective view showing that the present invention is applied to a projecting light.

The heat-dissipating body 2 (as shown in FIG. 4) can be made by means of extruding the aluminum material. The center of the heat-dissipating body is formed with a through hole 21. The upper end and the lower end of the through hole are different in diameter. The upside of the through hole 21 is used for connecting to the bottom of the heat-conducting member 1. A plurality of radial heat-dissipating fins 22 extends outwardly from the outer periphery of the heat-dissipating body 2.

Figure 5:
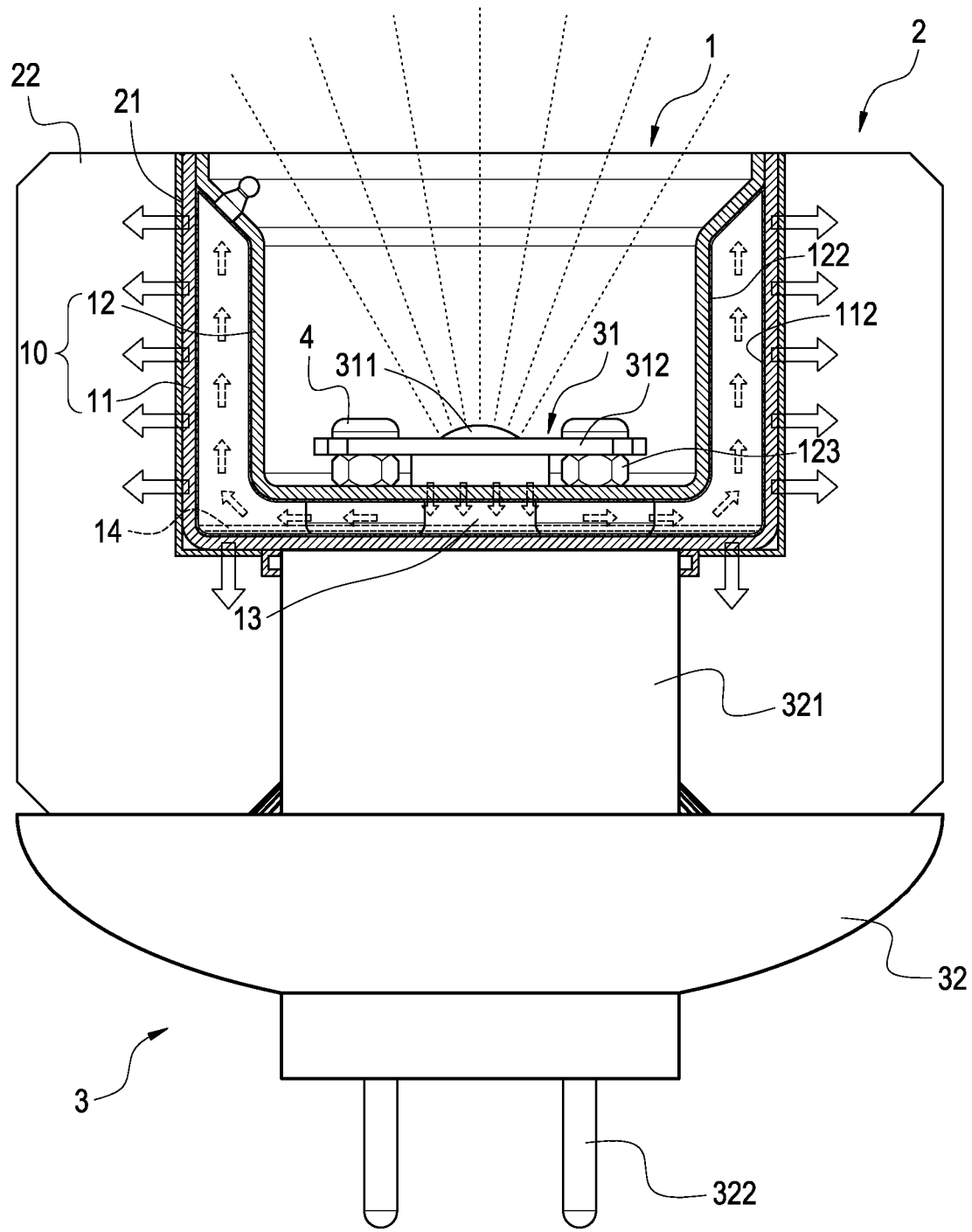
FIG. 5 is a cross-sectional view showing the operating state in which the present invention is applied to a projecting light.

FIGS. 4 and 5 are an exploded perspective view and a cross-sectional view showing the operating state in which the present invention is applied to a projecting light, respectively. The heat-dissipating module of the present invention can be applied to a projecting light 3. The projecting light 3 has a light-emitting unit 31 and an insertion seat 32 (as shown in FIG. 5) electrically connected to the light-emitting unit 31. A plurality of nuts 123 can be provided on the inside surface of the bottom of the inner casing 12. The light-emitting unit 31 comprises a light-emitting body 311 and a light seat 312 for receiving the light-emitting body 311. The outer periphery of the light seat 312 is provided with a plurality of notches 313 corresponding to the nuts 123, so that screws 4 are used to screw the light seat 312 onto the inner casing 12. Further, in order to increase the reflective intensity of the projecting light 3, a reflective layer can be coated on the inside surface of the inner casing 12, thereby to increase the illumination of the light-emitting body 311. Further, one end of the insertion seat 32 has an extension tube 321 received in the through hole 21 under the heat-dissipating body 2. The interior of the extension tube is provided with transformers, leads and other electronic elements. The other end of the insertion seat 32 has a contact terminal 322 for inserting into the socket of an external power supply.

In use, the contact terminal 322 of the insertion seat 32 is inserted into an external socket for supplying the necessary electricity to the light-emitting body 311 of the light-emitting unit 31. When the light-emitting body 311 is in use, it generates a great amount of heat. The thus-generated heat will be absorbed by the bottom surface of the inner casing 12 so as to heat the capillary structures 112, 122 within the partition space 13, thereby to vaporize the working fluid 14 absorbed in the capillary structures 112, 122. With the vaporization of the working fluid 14, the heat can be carried away, moved upwardly along the peripheral wall of the cylinder 10, dissipated outwardly to the heat-dissipating body 2 via the peripheral wall and finally dissipated to the outside via the heat-dissipating fins 22 of the heat-dissipating body 2. As a result, the light-emitting unit 31 can be continuously operated at a lower temperature, thereby to extend its life.

Figure 6:
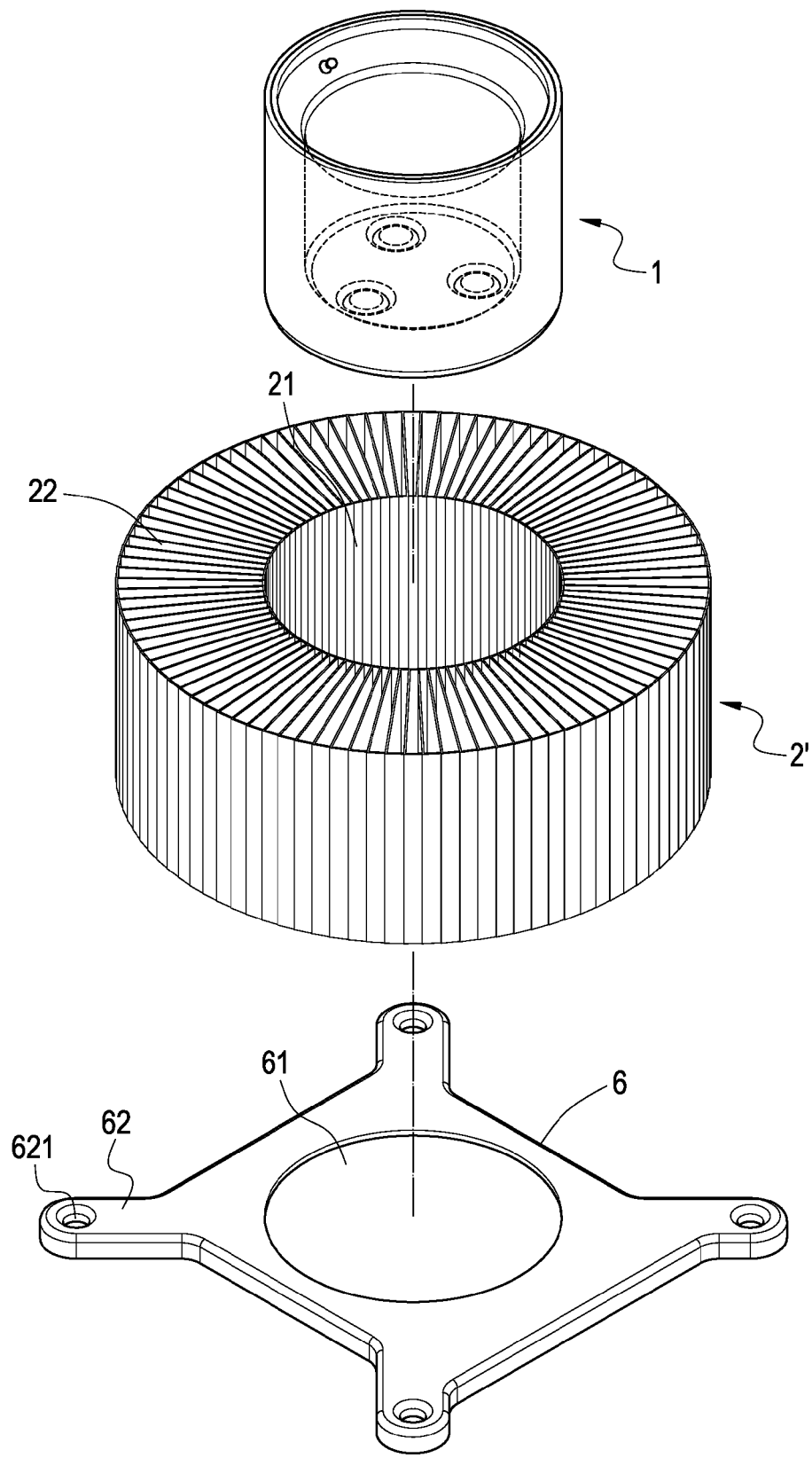
FIG. 6 is an exploded perspective view showing that the present invention is applied to a microprocessor.
Figure 7:
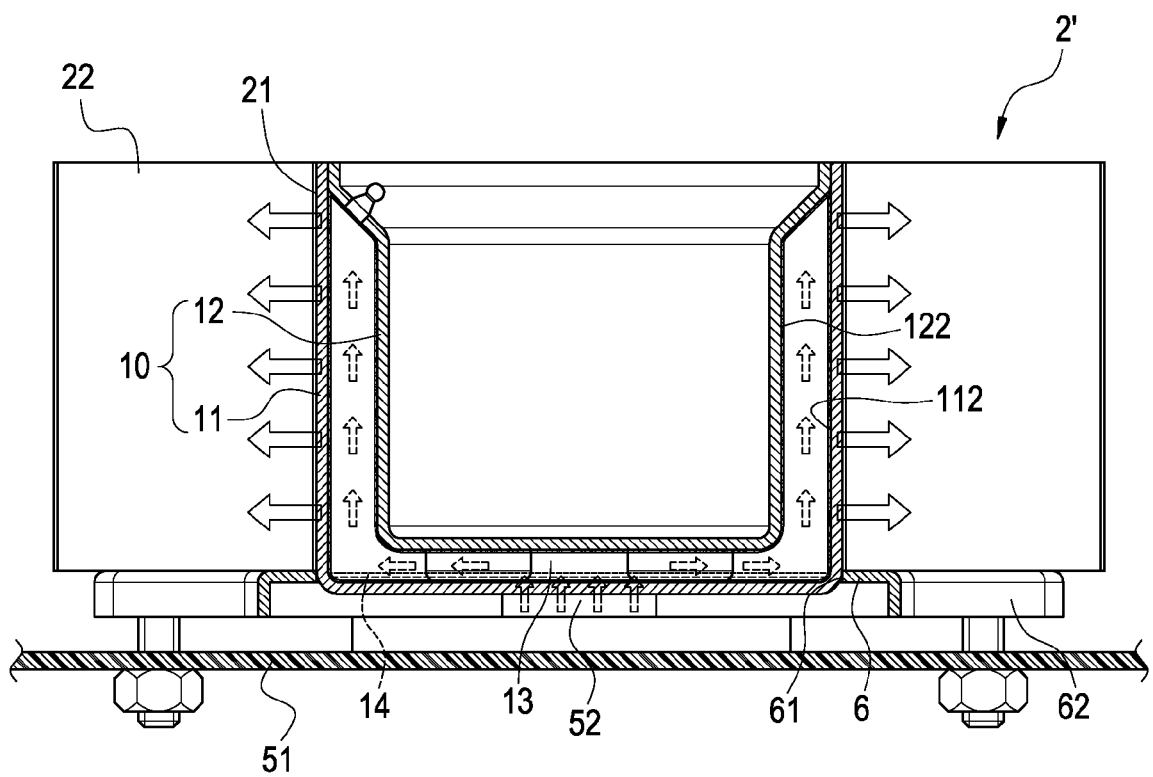
FIG. 7 is a cross-sectional view showing the operating state in which the present invention is applied to a microprocessor.

FIGS. 6 and 7 are an exploded perspective view and a cross-sectional view showing the operating state in which the present invention is applied to a microprocessor, respectively. In addition to the structure mentioned in the above embodiment, the heat-dissipating body 2' of the present embodiment can be adopted. The heat-dissipating body 2' is formed by stacking a plurality of heat-dissipating fins 22 with one another. The center of the heat-dissipating fins 22 is formed with a through hole 21 for being connected onto the outer periphery of the heat-conducting member 1. Then, the heat-dissipating body is mounted on a microprocessor of a computer host. The computer host has a printed circuit board 51 therein. The circuit board 51 is provided with various electronic elements such as the microprocessor 52. With a fixing base 6, the heat-dissipating model of the present invention can be fixedly provided on the circuit board 51. The center of the fixing base 6 is provided with a circular through hole 61 for connecting to the bottom periphery of the heat-conducting member 1. Further, supporting arms 62 extend outwardly from the four corners of the fixing base 6. Each supporting arm 62 is provided with a circular hole 621 thereon. The screws penetrate through the circular holes and the circuit board 51 and then are connected to the nuts.

When the microprocessor 51 generates a great amount of heat during operation, the heat is absorbed by the bottom surface of the inner casing 12 so as to heat the capillary structures 112, 122 within the partition space 13. Thus, the working fluid 14 absorbed in the capillary structures 112, 122 is vaporized. With the vaporization of the working fluid 14, the heat can be carried away, moved upwardly along the peripheral wall of the cylinder 10, conducted outwardly to the heat-dissipating body 2' along the peripheral wall face, and finally dissipated to the outside via the heat-dissipating fins 22 of the heat-dissipating body 2'. In this way, the microprocessor 52 can be continuously operated at a lower temperature and thus the life is extended.

According to the above, the heat-dissipating model of the present invention indeed has industrial applicability, novelty and inventive steps. Further, since the construction of the present invention has not been used in any products of the same kind or in public or published prior to applying for patent. Therefore, the present invention completely conforms to the requirements for a utility model patent.

Although the present invention has been described with reference to the foregoing preferred embodiments, it will be understood that the invention is not limited to the details thereof. Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A heat-dissipating model, comprising:
   a heat-conducting member having a hollow cylinder with a closed end, an interior of a wall of the cylinder formed with a vacuum chamber, the vacuum chamber provided with a capillary structure and a working fluid therein; and
   a heat-dissipating body having a through hole and connected to an outer periphery of the heat-conducting member, the periphery of the heat-dissipating body provided with a plurality of heat-dissipating fins,
   wherein the cylinder includes an outer casing and an inner casing connected to an inside of the outer casing, and
   wherein a plurality of positioning posts extend upwardly from a bottom of the outer casing, a plurality of projecting rings extend downwardly from a bottom of the inner casing, the projecting rings are respectively connected onto the positioning posts, and a partition space is formed between the bottoms of the outer casing and the inner casing.

2. The heat-dissipating model according to claim 1, wherein a cross section of the cylinder is any one of circle, cone, rectangle, pyramid or regular polygon.

3. The heat-dissipating model according to claim 1, wherein the capillary structure is made of porous materials formed by sintering metallic powders, or made of metallic woven mesh or the combination of the two.

4. The heat-dissipating model according to claim 1, wherein an inside surface of the inner casing is coated with a reflective layer.

5. The heat-dissipating model according to claim 1, wherein an inside surface of the bottom of the inner casing is provided with a plurality of nuts.

6. The heat-dissipating model according to claim 1, wherein the heat-dissipating body is directly made by means of extruding aluminum materials.

7. The heat-dissipating model according to claim 1, wherein the heat-dissipating body is formed by stacking a plurality of heat-dissipating fins with one another.

8. A heat-dissipating model, comprising:

a heat-conducting member having a hollow cylinder with a closed end, an interior of a wall of the cylinder formed with a vacuum chamber, the vacuum chamber provided with a capillary structure and a working fluid therein; and a heat-dissipating body having a through hole and connected to an outer periphery of the heat-conducting member, the periphery of the heat-dissipating body provided with a plurality of heat-dissipating fins, wherein the cylinder includes an outer casing and an inner casing connected to an inside of the outer casing, and wherein an inside surface of the inner casing is coated with a reflective layer.

9. A heat-dissipating model, comprising:

a heat-conducting member having a hollow cylinder with a closed end, an interior of a wall of the cylinder formed with a vacuum chamber, the vacuum chamber provided with a capillary structure and a working fluid therein; and a heat-dissipating body having a through hole and connected to an outer periphery of the heat-conducting member, the periphery of the heat-dissipating body provided with a plurality of heat-dissipating fins, wherein the cylinder includes an outer casing and an inner casing connected to an inside of the outer casing, and wherein an inside surface of the bottom of the inner casing is provided with a plurality of nuts.

* * * * *